(12) United States Patent
Yang et al.

(10) Patent No.: US 10,690,737 B2
(45) Date of Patent: Jun. 23, 2020

(54) HIDDEN COIL TRANSMISSION LINES IN MAGNETIC RESONANCE IMAGING (MRI) COIL

(71) Applicant: Quality Electrodynamics, LLC, Mayfield Village, OH (US)

(72) Inventors: Xiaoyu Yang, Indiana, PA (US); Tsinghua Zheng, Chesterland, OH (US); Haoqin Zhu, Mayfield Village, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 6 days.

(21) Appl. No.: 16/218,609

(22) Filed: Dec. 13, 2018

(65) Prior Publication Data

US 2019/0187227 A1  Jun. 20, 2019

Related U.S. Application Data

(60) Provisional application No. 62/608,169, filed on Dec. 20, 2017.

(51) Int. Cl.
*G01R 33/36* (2006.01)
*G01R 33/341* (2006.01)
*G01R 33/34* (2006.01)
*G01R 33/3415* (2006.01)

(52) U.S. Cl.
CPC ....... *G01R 33/3628* (2013.01); *G01R 33/341* (2013.01); *G01R 33/34007* (2013.01); *G01R 33/3415* (2013.01); *G01R 33/3685* (2013.01)

(58) Field of Classification Search
CPC ............ G01R 33/3628; G01R 33/3415; G01R 33/34007; G01R 33/341; G01R 33/3685
See application file for complete search history.

(56) References Cited

U.S. PATENT DOCUMENTS

| | | | | |
|---|---|---|---|---|
| 4,691,163 | A * | 9/1987 | Blass | G01R 33/3635 324/309 |
| 5,905,378 | A * | 5/1999 | Giaquinto | G01R 33/34084 324/318 |
| 7,382,132 | B1 * | 6/2008 | Mathew | G01R 33/34084 324/318 |
| 9,678,180 | B2 | 6/2017 | Yang et al. | |
| 9,933,501 | B2 | 4/2018 | Yang et al. | |
| 2004/0189300 | A1 * | 9/2004 | Burl | G01R 33/3415 324/318 |

\* cited by examiner

*Primary Examiner* — G. M. A Hyder
(74) *Attorney, Agent, or Firm* — Eschweiler & Potashnik, LLC (57) ABSTRACT

Embodiments relate to magnetic resonance imaging (MRI) radio frequency (RF) coil arrays having reduced coupling via hidden transmission lines. One example embodiment comprises a MRI RF coil array comprising: a first RF coil element coupled to a first output transmission cable (e.g., coaxial) that is configured to carry a first signal that is associated with the first RF coil element; a second RF coil element coupled to a second output transmission cable that is configured to carry a second signal that is associated with the second RF coil element, wherein the second RF coil element comprises a first portion of the first output transmission cable; and a first balun configured to reduce coupling associated with the first signal, wherein the first balun is arranged between the first RF coil element and the second RF coil element. Additional coil elements can be similarly combined in embodiments.

24 Claims, 9 Drawing Sheets

HIDDEN COIL TRANSMISSION LINES IN MAGNETIC RESONANCE IMAGING (MRI) COIL

REFERENCE TO RELATED APPLICATIONS

This application claims the benefit of U.S. Provisional Patent Applications No. 62/608,169 filed Dec. 20, 2017, entitled "HIDDEN COIL TRANSMISSION LINES IN MAGNETIC RESONANCE IMAGING (MRI) COIL", the contents of which are herein incorporated by reference in their entirety.

BACKGROUND

Magnetic resonance imaging (MRI) involves the transmission and receipt of radio frequency (RF) energy. RF energy may be transmitted by a coil. Resulting magnetic resonance (MR) signals may also be received by a coil. In early MRI, RF energy may have been transmitted from a single coil and resulting MR signals received by a single coil. Later, multiple receivers may have been used in parallel acquisition techniques. Similarly, multiple transmitters may have been used in parallel transmission (pTx) techniques.

RF coils create the $B_1$ field that rotates the net magnetization in a pulse sequence. RF coils may also detect precessing transverse magnetization. Thus, RF coils may be transmit (Tx) coils, receive (Rx) coils, or transmit and receive (Tx/Rx) coils. An imaging coil should be able to resonate at a selected Larmor frequency. Imaging coils include inductive elements and capacitive elements. The inductive elements and capacitive elements have been implemented according to existing approaches using two terminal passive components (e.g., capacitors). The resonant frequency, v, of an RF coil is determined by the inductance (L) and capacitance (C) of the inductor capacitor circuit according to equation (1):

$$v = \frac{1}{2\pi\sqrt{LC}} \quad (1)$$

Imaging coils may need to be tuned. Tuning an imaging coil may include varying the performance of a capacitor. Recall that frequency: $f=\omega/(2\pi)$, wavelength: $\lambda=c/f$, and $\lambda=4.7$ m at 1.5 T. Recall also that the Larmor frequency: $f_0=\gamma B_0/(2\pi)$, where $\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$).

In existing systems, when MRI coils that are tuned to the same radio frequency are positioned close together, which may occur, for example, in phased array coils, the MRI coils may inductively couple to each other, which causes the MRI coils to detune each other. Detuning due to inductive coupling reduces image quality as compared to using single coils individually. Existing phased array coils may address the detuning due to inductive coupling problem by overlapping coils or by using preamplifiers that dampen current flow in individual coils.

DETAILED DESCRIPTION

The present disclosure will now be described with reference to the attached drawing figures, wherein like reference numerals are used to refer to like elements throughout, and wherein the illustrated structures and devices are not necessarily drawn to scale.

Various embodiments discussed herein comprise MRI (Magnetic Resonance Imaging) coils employable in a multiple-coil MRI system having reduced coupling (inductive and/or capacitive) between channels, and methods of employing such coils and/or multiple-coil system. Embodiments discussed herein can employ coil element(s) with signal transmission cables of one or more other coil elements hidden in the coil element(s), providing for reduced coupling between the coil element(s) and the one or more other coil elements. In various aspects, embodiments discussed herein can comprise coil arrays that employ hidden signal transmission cable techniques discussed herein, and/or MRI systems comprising such coil arrays.

Figure 1:
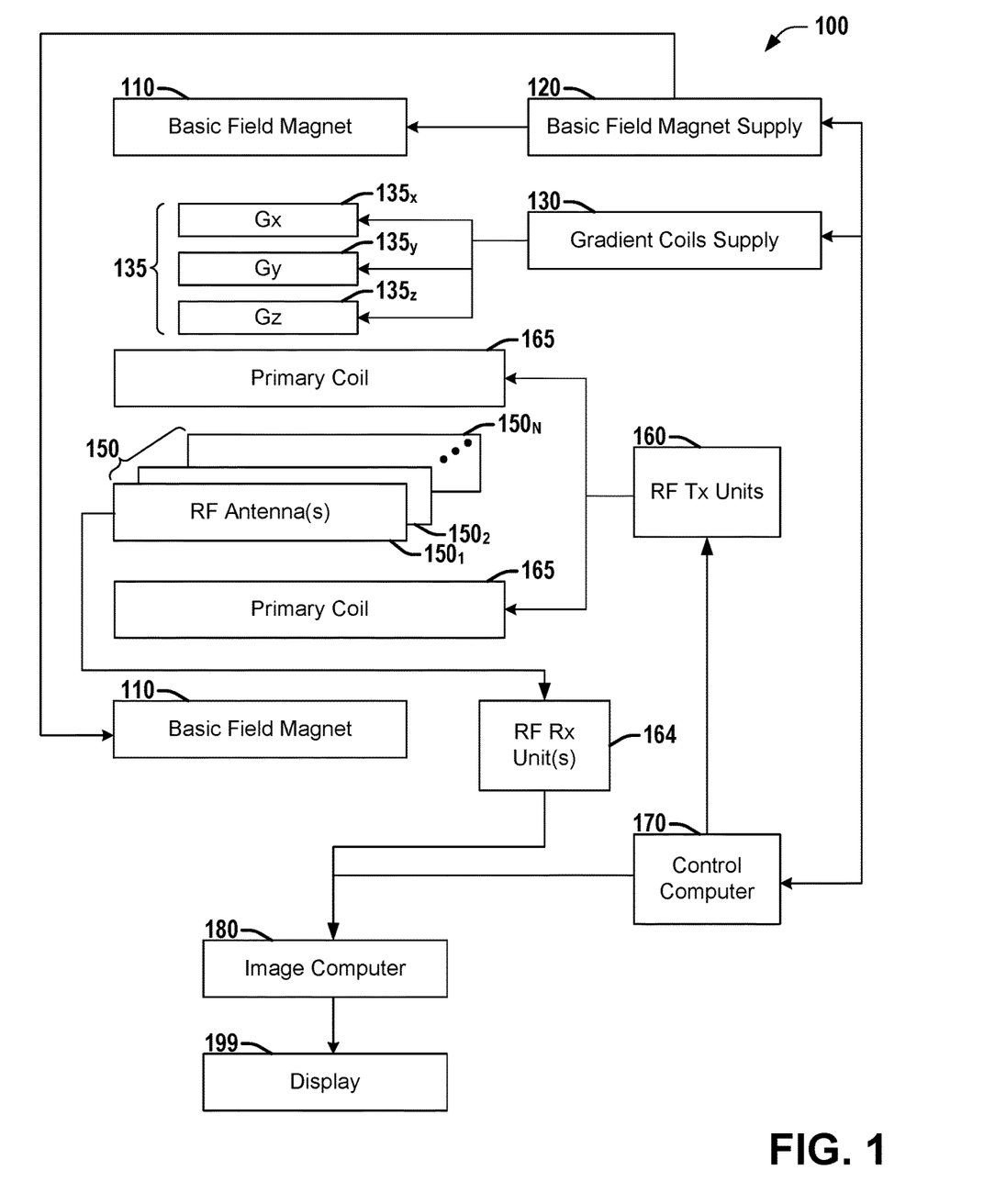
FIG. 1 is a block diagram illustrating an example MRI apparatus that can be configured with example MRI RF coils, coil elements, coil arrays, or circuitry according to one or more embodiments described herein.

Embodiments described herein can be implemented in a MRI (Magnetic Resonance Imaging) system using any suitably configured hardware and/or software. Referring to FIG. 1, illustrated is an example MRI apparatus 100 that can be configured with example MRI RF coils, coil elements, coil arrays, or circuitry according to one or more embodiments described herein. Apparatus 100 includes basic field magnet(s) 110 and a basic field magnet supply 120. Ideally, the basic field magnets 110 would produce a uniform $B_0$ field. However, in practice, the $B_0$ field may not be uniform, and may vary over an object being imaged by the MRI apparatus 100. MRI apparatus 100 can include gradient coils 135 configured to emit gradient magnetic fields like $G_x$ (e.g., via an associated gradient coil $135_x$), $G_y$ (e.g., via an associated gradient coil $135_y$) and $G_z$ (e.g., via an associated gradient coil $135_z$). The gradient coils 135 can be controlled, at least in part, by a gradient coils supply 130. In some examples, the timing, strength, and orientation of the gradient magnetic fields can be controlled, and thus selectively adapted during an MRI procedure.

MRI apparatus 100 can include a primary coil 165 configured to generate RF pulses. The primary coil 165 can be a whole body coil. The primary coil 165 can be, for example, a birdcage coil. The primary coil 165 can be controlled, at least in part, by an RF transmission unit 160. RF transmission unit 160 can provide a signal to primary coil 165.

MRI apparatus 100 can include a set of RF antennas 150 (e.g., one or more RF antennas $150_1$-$150_N$, which can be as described herein). RF antennas 150 can be configured to generate RF pulses and to receive resulting magnetic resonance signals from an object to which the RF pulses are directed. RF antennas 150 can be configured to inductively couple with primary coil 165 and generate RF pulses and to receive resulting magnetic resonance signals from an object to which the RF pulses are directed. In one embodiment, a member of the set of RF antennas 150 can be fabricated from flexible coaxial cable, or other conductive material. The set of RF antennas 150 can be connected with an RF receive unit 164.

The gradient coils supply 130 and the RF transmission units 160 can be controlled, at least in part, by a control computer 170. The magnetic resonance signals received from the set of RF antennas 150 can be employed to generate an image, and thus can be subject to a transformation process like a two dimensional fast Fourier transform (FFT) that generates pixilated image data. The transformation can be performed by an image computer 180 or other similar processing device. The image data can then be shown on a display 199. RF Rx Units 164 can be connected with control computer 170 or image computer 180. While FIG. 1 illustrates an example MRI apparatus 100 that includes various components connected in various ways, it is to be appreciated that other MRI apparatus can include other components connected in other ways, and can be employed in connection with various embodiments discussed herein.

In one embodiment, MRI apparatus 100 includes control computer 170. In one example, a member of the set of RF antennas 150 can be individually controllable by the control computer 170. A member of the set of RF antennas 150 can be an example MRI RF coil array including, for example, MRI RF coil arrays as described herein. In various embodiments, the set of RF antennas 150 can include various combinations of example embodiments of MRI RF coil arrays, elements or example embodiments of MRF RF coil arrays, including single-layer MRI RF coil elements or single-layer MRI RF coil arrays, according to various embodiments described herein.

An MRI apparatus can include, among other components, a controller (e.g., control computer 170) and an RF coil (e.g., primary coil 165) operably connected to the controller. The controller can provide the RF coil with a current, a voltage, or a control signal. The coil can be a whole body coil. The coil can inductively couple with an example MRI RF coil element, or MRI RF coil array, as described herein. Control computer 170 can provide a DC bias current, or control a DC bias control circuit to control the application of a DC bias current to MRI RF coil arrays or elements that can be part of antennas 150.

Figure 2:
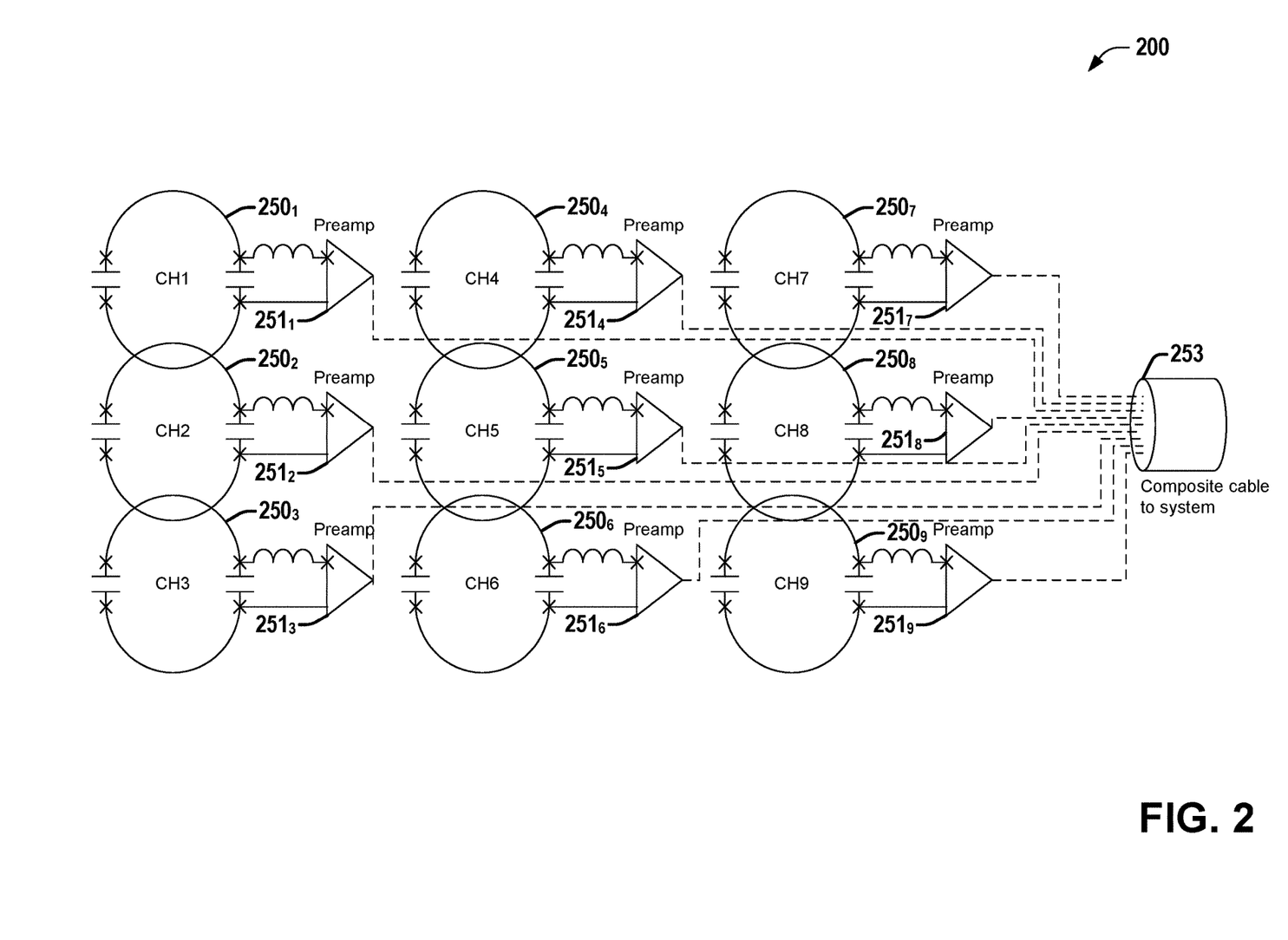
FIG. 2 is a diagram illustrating an example MRI RF antenna system 200 involving a 3×3 (9 channels) MRI coil signal cable routing scenario.

In a multiple-channel MRI coil, the signal transmission cable of each channel is always close to other channels. As an example, FIG. 2 illustrates a MRI RF antenna system 200 involving a 3×3 (9 channels: Channel 1 (CH1 $250_1$)-Channel 9 (CH9 $250_9$)) MRI coil signal cable routing scenario. In various embodiments, system 200 can be employed as RF antennas $150_i$ in an MRI system, e.g., example MRI system 100, according to existing techniques. As shown in FIG. 2, for each channel CH1 ($250_1$)-CH9 ($250_9$) to connect to the composite cable 253 to the MRI system (e.g., system 100), the signal transmission lines (dashed lines from each channel) are very close to other channels, for example, with the CH1 $250_1$ signal cable arranged on top of CH4 ($250_4$), CH5 ($250_5$), CH7 ($250_7$) and CH8 ($250_8$) to reach the composite cable 253. The preamplifiers $251_1$-$251_9$ here are optional. When the signal transmission lines are close to other channels, the transmission lines will have non-trivial mutual inductive coupling and/or parasitic capacitive coupling to nearby channels. These couplings create unexpected noise and reduce the SNR (Signal-to-Noise Ratio) of the coil. To mitigate the couplings, multiple baluns (not shown in FIG. 2) are often used on cables to reduce the couplings. However, the routing of the signal transmission cables, the positions of the baluns and the strengths of baluns are very complicated and challenging. Various embodiments discussed herein address this challenge by hiding the signal transmission cables into the coil elements so that the coupling is minimized.

Figure 3:
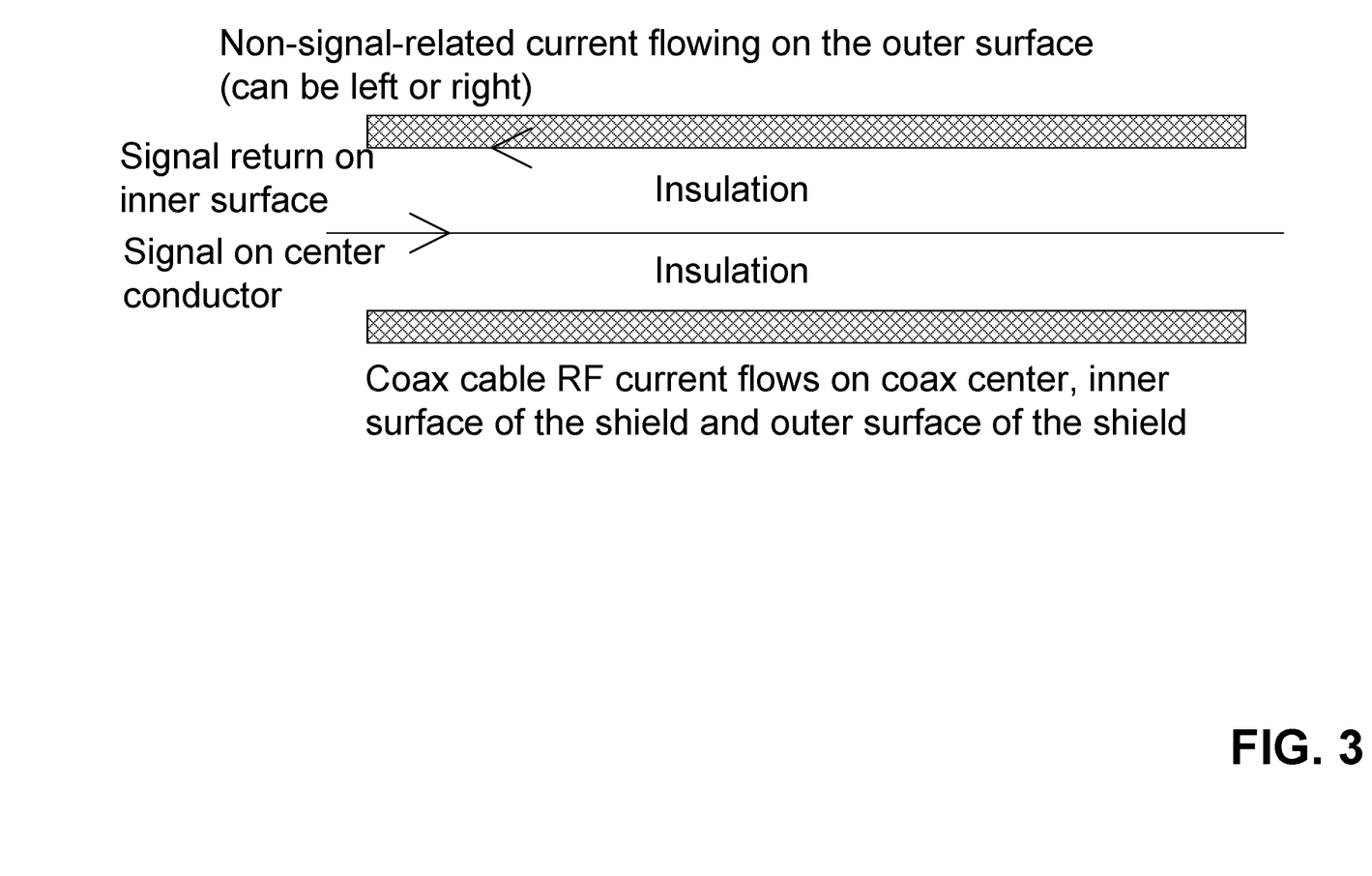
FIG. 3 is a diagram illustrating the RF current flow in the cross section of a coax cable that transmits an RF signal.

Embodiments discussed herein can employ signal transmission cables or coaxial (coax) cables. Referring to FIG. 3, illustrated is a diagram showing the RF current flow in the cross section of a coax cable that transmits an RF signal. As shown in FIG. 3, a coax cable has three critical conductive paths. The first conductive path is the center conductor of the coax cable, which can be used for the signal. The second conductive path is the inner surface of the cable shield, which can be used for the signal return. The third conductive path is the outer surface of the cable shield, which can be used for non-signal-related current flowing, such as RF coupling current. Because the signal in and return current have the same magnitude, there is no coupling between the non-signal-related current and the signal current. Thus, the signal and non-signal-related current can co-exist without interference. In various embodiments discussed herein, the outer surface of the coax cable shield (transmission line) can be used for the coil element, and the center conductor and the inner surface of cable shield can be used to transmit RF signal(s) of other coil elements.

Figure 4:
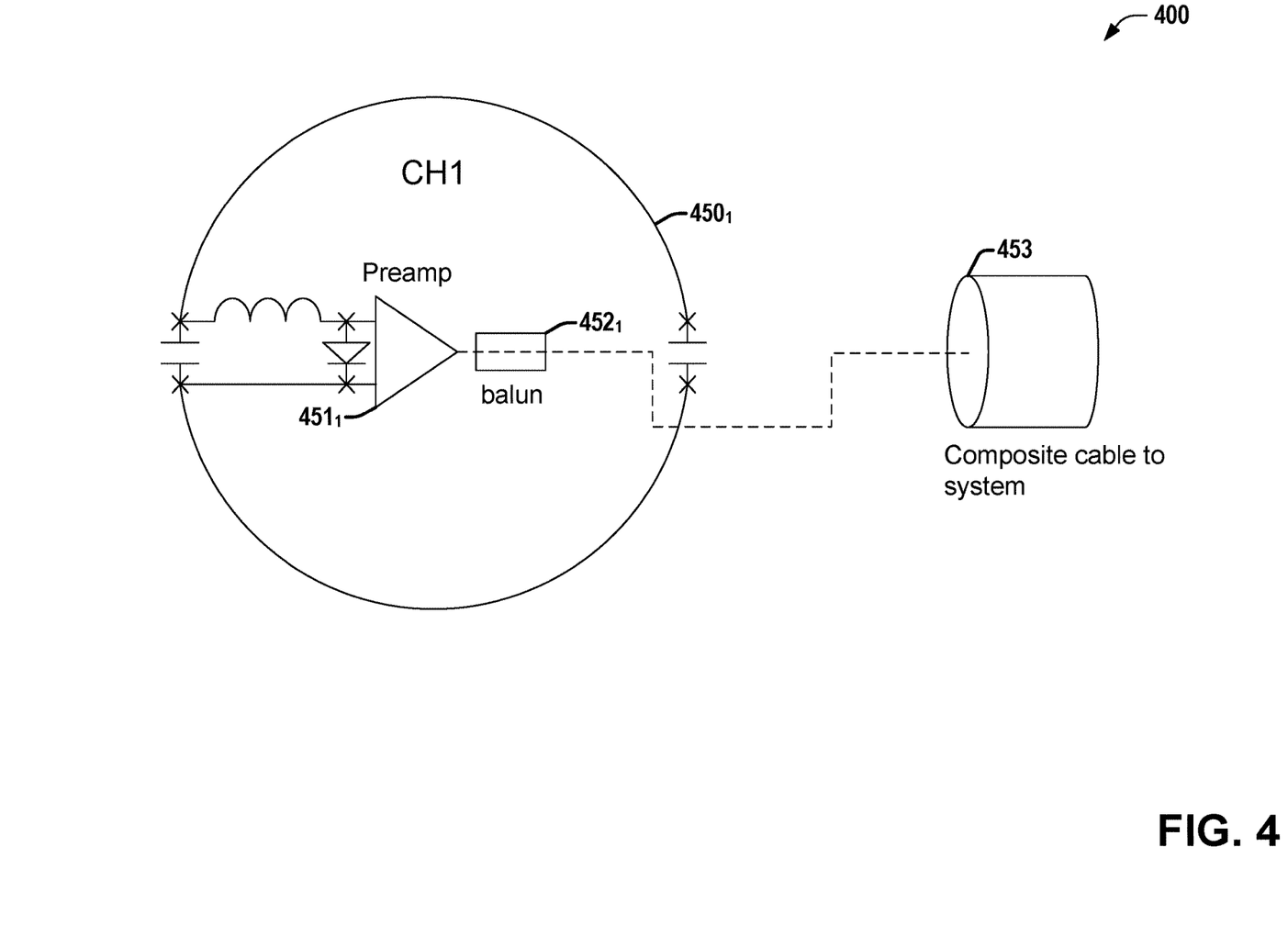
FIG. 4 is a diagram illustrating a typical scenario of a MRI RF antenna system 400 comprising a one-channel coil where its cable crosses itself.

A first example embodiment illustrates how these techniques can be employed to hide the cable for a coil with a single channel. Referring to FIG. 4, illustrated is a diagram showing a typical scenario of a MRI RF antenna system 400 comprising a one-channel coil (CH1 $450_1$) where its cable crosses itself. In various embodiments, system 400 can be employed as RF antennas $150_i$ in an MRI system, e.g., example MRI system 100, according to existing techniques. In the scenario of FIG. 4, the cable (dashed line) crosses the coil element of CH1 $450_1$ itself to reach composite cable 453. Also shown is optional preamp $451_1$. Even though there is a balun $452_1$ on the coax cable, the coupling between the coil and its own coax cable is still very difficult to eliminate, because the coupling is strong. This is a common scenario resulting from existing techniques.

Figure 5:
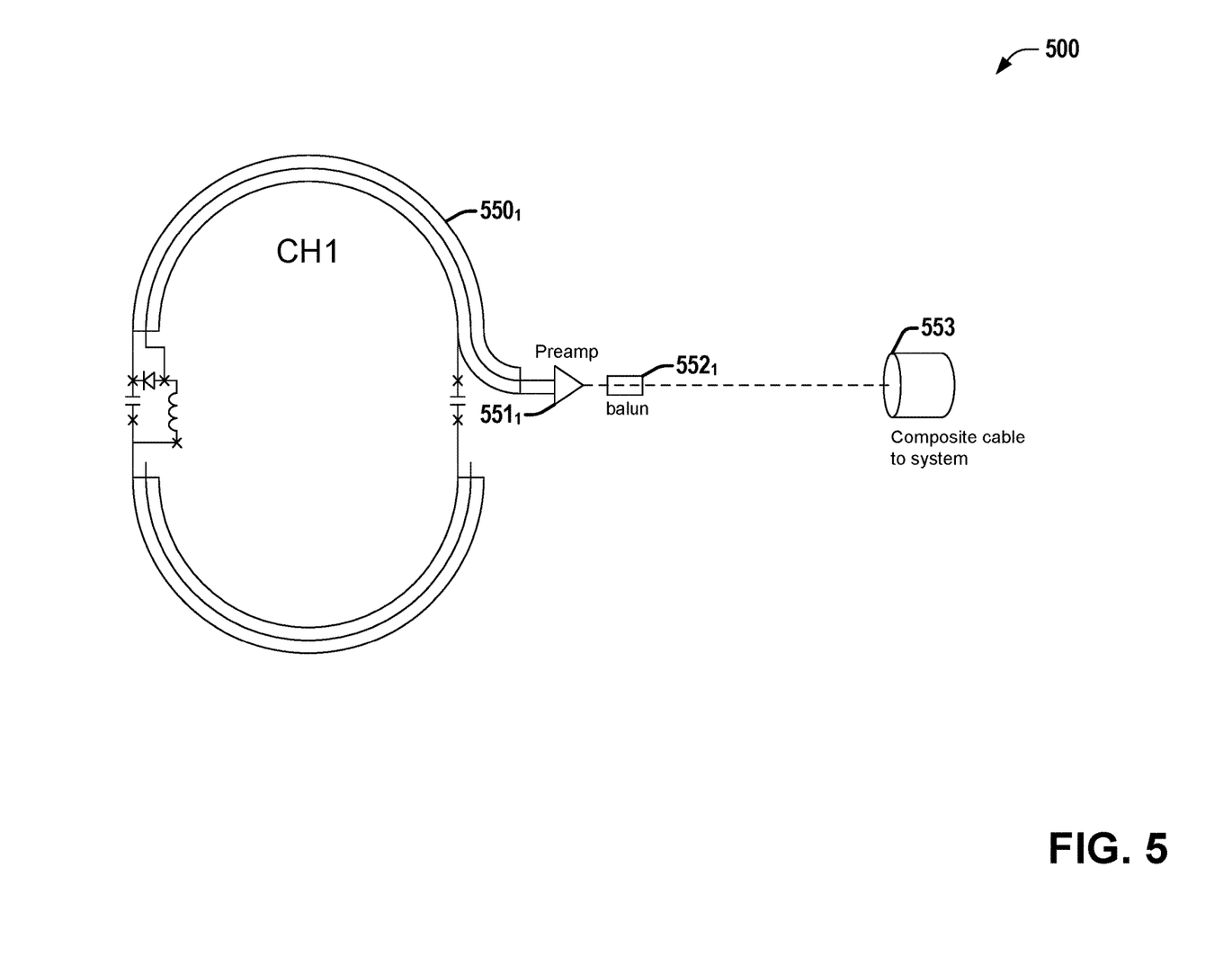
FIG. 5 is a diagram illustrating an example MRI RF antenna system comprising an example one-channel coil, in accordance with various aspects discussed herein.

However, various embodiments discussed herein can hide signal cable(s) inside coil element(s) to significantly reduce coupling even when the signal cable(s) cross the coil element(s). Referring to FIG. 5, illustrated is a diagram showing an example MRI RF antenna system 500 comprising an example one-channel (CH1 $550_1$) coil, in accordance with various aspects discussed herein. In various embodiments, system 500 can be employed as RF antennas $150_i$ in an MRI system, e.g., example MRI system 100, according to various embodiments discussed herein. As shown in FIG. 5, the coil element of CH1 $550_1$ has its signal cable hidden inside the coil element $550_1$ such that the coax cable cannot be "seen" by the coil element because the in and return signals have same magnitude and 180 degree phase difference, as discussed in connection with FIG. 3. As a result there is no coupling between the coil and the cable when the cable crosses coil. As with other coils, a balun $552_1$ is also employed between the coil (and optional preamp $551_1$) and the composite cable 553. Since the cable (the dashed line) on the right side of the balun $552_1$ does not cross the coil element of CH1 $550_1$, the coupling is much smaller than in FIG. 4. Therefore, the same strength balun $552_1$ can achieve significantly improved isolation between the cable 553 and the coil element of CH1 $550_1$ compared to existing systems (e.g., system 400). Additionally, in various embodiments, a piece of copper foil or trace can be shorted to (e.g., via soldering, etc.) the coax cable section shield that makes the coil element of CH1 $550_1$. In general, a wider copper foil or trace has less RF loss than the coax cable shield.

Figure 6:
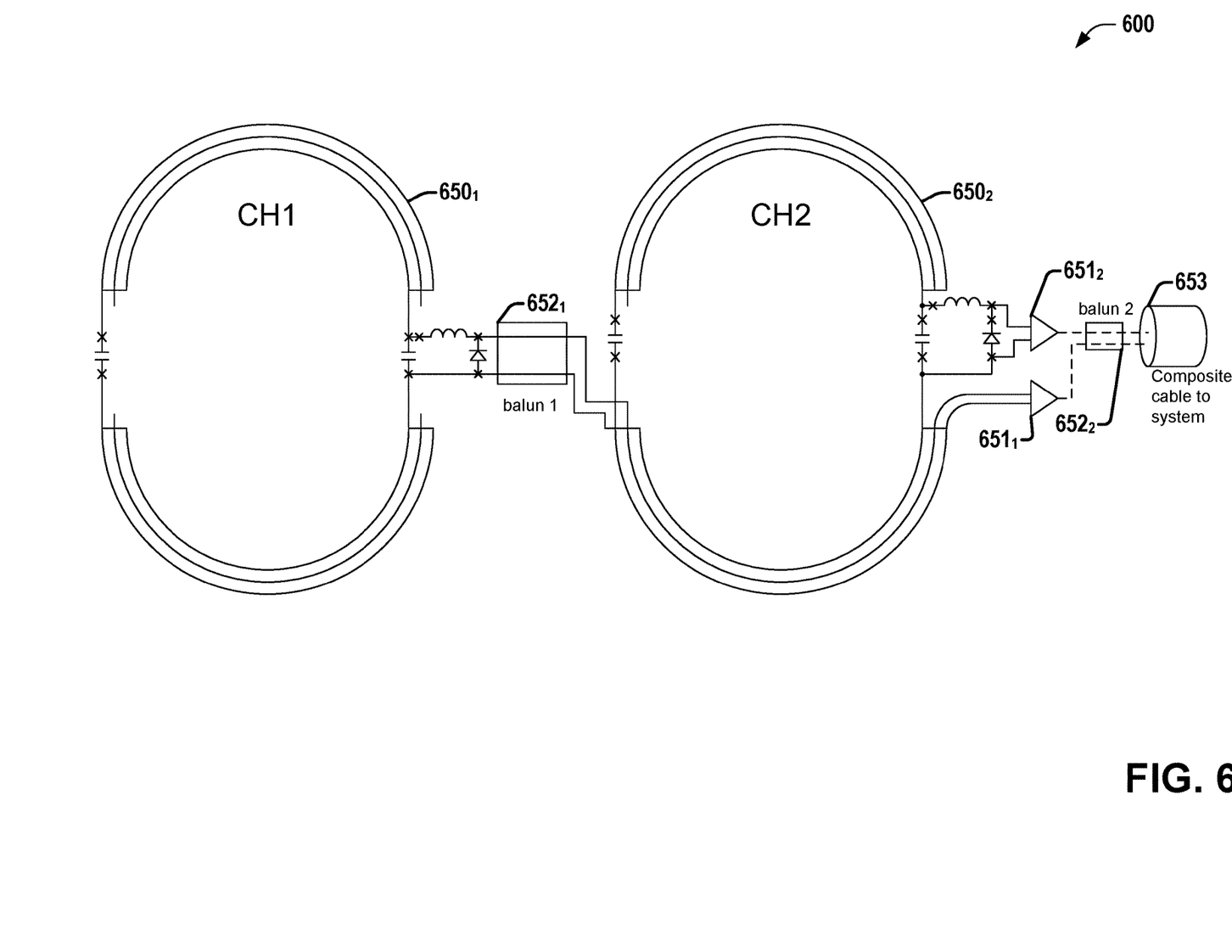
FIG. 6 is a diagram illustrating an example MRI RF antenna system comprising an example two-channel coil array, in accordance with various aspects discussed herein.

Referring to FIG. 6, illustrated is a diagram showing an example MRI RF antenna system 600 comprising an example two-channel (CH1 $650_1$ and CH2 $650_2$) coil array, in accordance with various aspects discussed herein. In various embodiments, system 600 can be employed as RF antennas $150_i$ in an MRI system, e.g., example MRI system 100, according to various embodiments discussed herein. If a coil signal transmission coax cable (e.g., from CH1 $650_1$) crosses another coil element (e.g., the coil element of CH2 $650_2$), the technique for hiding the signal transmission coax cable of one coil element (e.g., coil element $650_1$ of CH1) in the other coil element (e.g., the coil element of CH2 $650_2$) is shown in FIG. 6. The signal cable of CH1 $650_1$ in FIG. 6 crosses another coil element (e.g., of CH2 $650_2$), as shown in FIG. 6. The CH1 $650_1$ cable can be hidden as shown in FIG. 6. A first balun (balun $652_1$) can be employed between CH1 $650_1$ and CH2 $650_2$. As shown in FIG. 6, each channel (CH1 $650_1$ and CH2 $650_2$) has its signal cable cross itself. The hidden cable approach discussed herein minimizes the coupling between cable(s) (of CH1 $650_1$) and coil element(s) (e.g., the coil element of CH2 $650_2$). Additionally, the preamplifier $651_1$ for CH1 $650_1$ can be either in the first balun $652_1$ area or (as shown) the second balun $652_2$ area, near the preamplifier $651_2$ for CH2 $650_2$. The only difference between these two arrangements is that the preamplifier $651_1$ of CH1 $650_1$ has a little bit more coax cable loss if it is put at the second balun $652_2$ area instead of the first balun $652_1$ area.

Although FIG. 6 shows a system 600 with two channels CH1 $650_1$ and CH2 $650_2$ to simplify illustration of the techniques disclosed herein, in real situations the coil can have a significant number of channels, i.e., the coil may have multiple rows and columns of coil elements. In such a scenario, the farthest channel element will cross multiple elements to reach the composite cable joint point.

Figure 7:
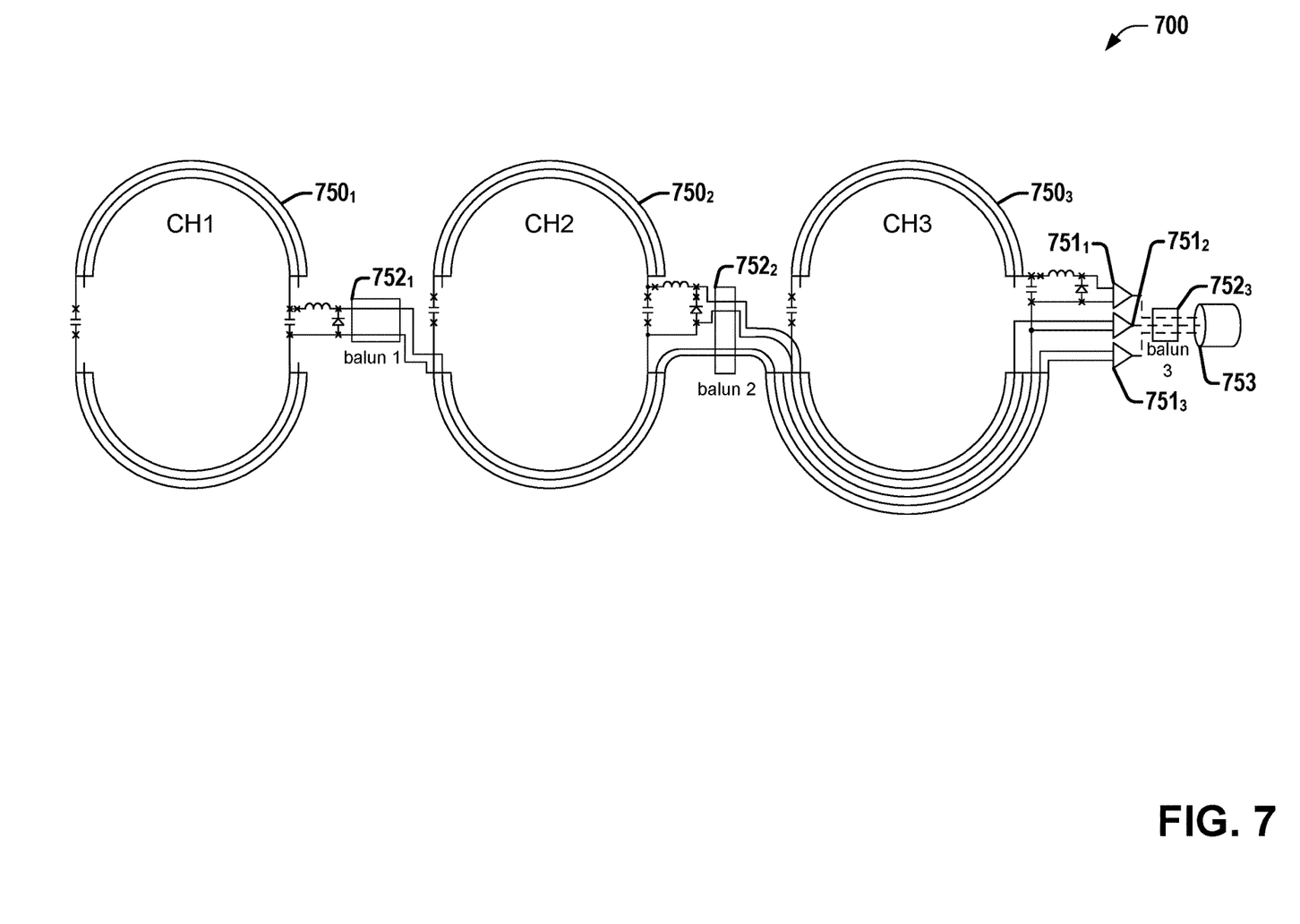
FIG. 7 is a diagram illustrating an example MRI RF antenna system comprising an example multiple-channel coil array employing a first technique for hiding the signal transmission coax cable of a first channel when crossing two or more other coil elements, in accordance with various aspects discussed herein.

Referring to FIG. 7, illustrated is a diagram showing an example MRI RF antenna system 700 comprising an example multiple-channel coil array employing a first technique for hiding the signal transmission coax cable of a first channel (CH1 $750_1$) when crossing two or more other coil elements (e.g., those of CH2 $750_2$ and CH3 $750_3$), in accordance with various aspects discussed herein. In various embodiments, system 700 can be employed as RF antennas $150_i$ in an MRI system, e.g., example MRI system 100, according to various embodiments discussed herein. FIG. 7 shows one possible approach for crossing two channel elements. For the approach of FIG. 7, there is a first balun $752_1$ between CH1 $750_1$ and CH2 $750_2$, and a second balun $752_2$ between CH2 $750_2$ and CH3 $750_3$. In the first approach, as shown in system 700 of FIG. 7, there are two coax cables in the lower side of CH3 $750_3$, carrying the CH1 $750_1$ and CH2 $750_2$ signals within, while their shields are used for the coil element of CH3 $750_3$. Thus, the shields of both coax cables (for CH1 $750_1$ and CH2 $750_2$) are shorted together so that they can act as one conductor for the channel element of CH3 $750_3$.

Figure 8:
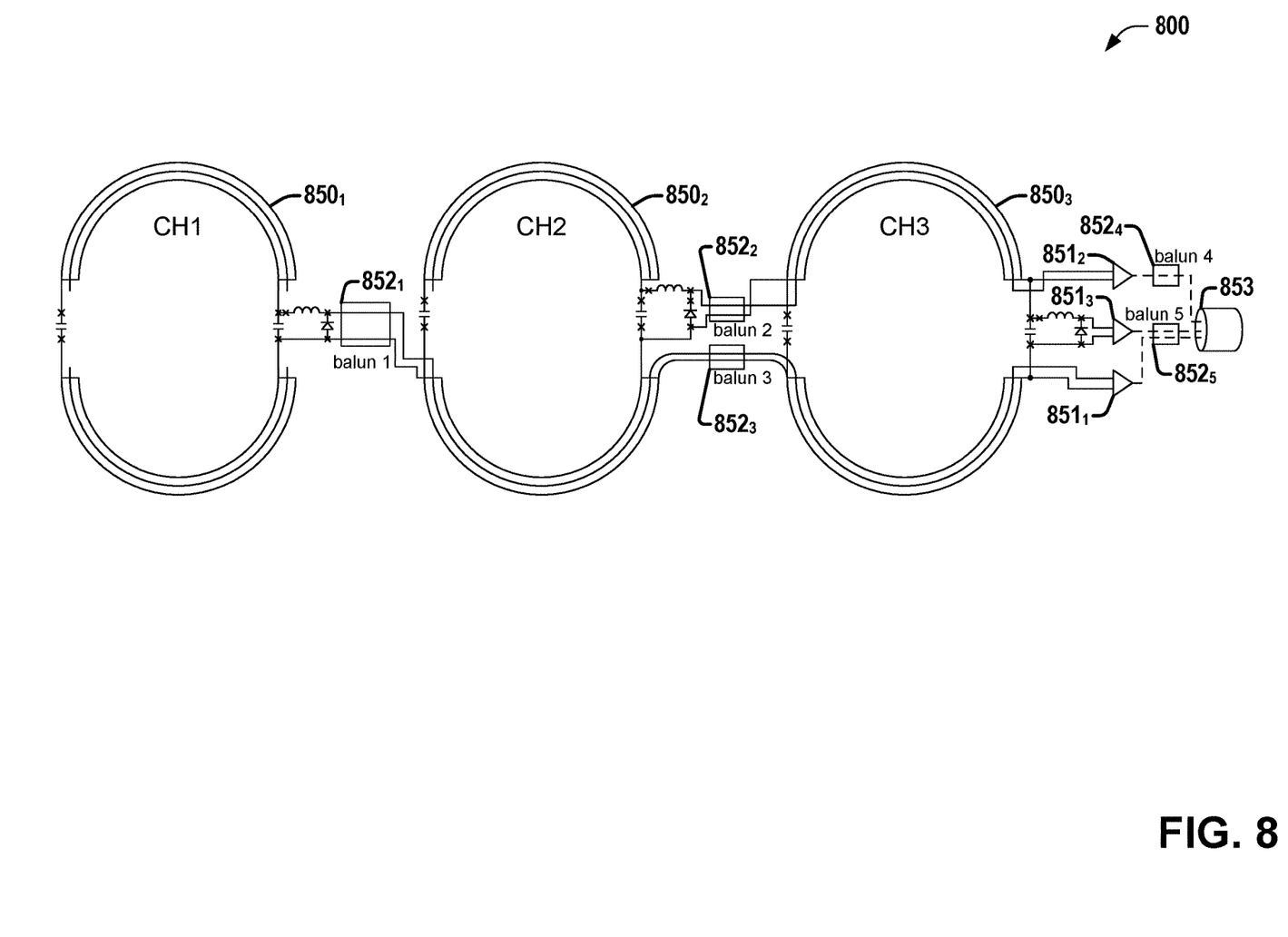
FIG. 8 is a diagram illustrating an example MRI RF antenna system comprising an example multiple-channel coil array employing a second technique for hiding the signal transmission coax cable of a first channel when crossing two or more other coil elements, in accordance with various aspects discussed herein.

Referring to FIG. 8, illustrated is a diagram showing an example MRI RF antenna system 800 comprising an example multiple-channel coil array employing a second technique for hiding the signal transmission coax cable of a first channel CH1 $850_1$ when crossing two or more other coil elements (e.g., those of CH2 $850_2$ and CH3 $850_3$), in accordance with various aspects discussed herein. In various embodiments, system 800 can be employed as RF antennas $150_i$ in an MRI system, e.g., example MRI system 100, according to various embodiments discussed herein. The difference between FIG. 8 and FIG. 7 is how the signals of CH1 and CH2 cross CH3. In FIG. 7, the signals of both CH1 $750_1$ and CH2 $750_2$ go through the lower side of CH3 $750_3$. As a result, in FIG. 7, only one balun (balun $752_2$) is employed between CH2 $750_2$ and CH3 $750_3$, but two coax cables are employed on the lower side of CH3 $750_3$. In contrast, in FIG. 8, CH1 $850_1$ goes through the lower side of CH3 $850_3$, and CH2 $850_2$ goes through the upper side of CH3 $850_3$, and there is no additional coax cable as in FIG. 7. However, the disadvantage of the approach of FIG. 8 is that additional baluns are employed, such as balun $852_3$ and balun $852_4$ in FIG. 8. In embodiments wherein the farthest channel element crosses more than three channel elements, a similar approach as in FIGS. 7 and 8 can be employed, wherein one or two baluns are used between the adjacent channel elements and more than two coax cables are shorted together (e.g., via soldering, etc.) to act as one conductor as part of a channel element, while allowing more than two signals to go through. As discussed above, in various embodiments, all bundled coax cable shields can be shorted to (e.g., via soldering, etc.) a copper or conductor foil/trace which can be part of the coil channel element.

Figure 9:
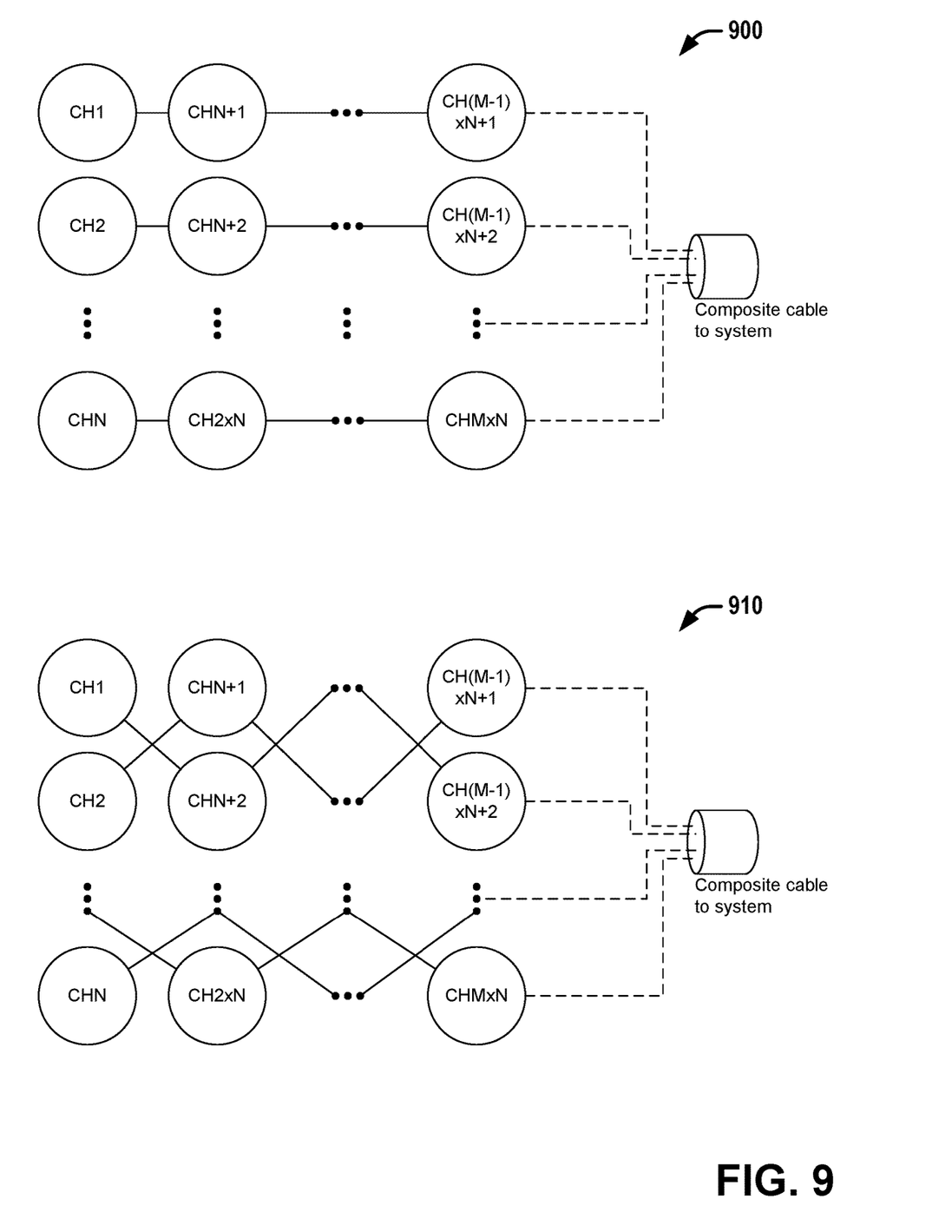
FIG. 9 is a pair of diagrams illustrating two example geometric arrangements of M groups of N connected channels via hidden signal transmission coax cable techniques according to various aspects discussed herein.

In various embodiments, two or more (e.g., N) channels can be coupled together in a group based on techniques discussed herein such that the signal transmission coax cable of a first (farthest from the composite cable) channel (CH1) of the group is hidden in the coil element(s) of all subsequent channel(s) (CH2-CHN) of the group, the signal transmission coax cable of a second (second farthest from the composite cable) channel (CH1) of the group is hidden in the coil element(s) of all subsequent channel(s) (CH3-CHN, if N>2) of the group, and so forth. In various embodiments, a coil array (e.g., which can be employed as RF antennas $150_i$ in an MRI system, e.g., example MRI system 100, according to various embodiments discussed herein) can comprise one or more such groups of coupled channels (e.g., wherein different groups can comprise the same or different numbers of channels), such as, for example, an M×N array of channels, with M distinct groups of N channels, wherein each channel other than the farthest channel of each group hides the signal cables of farther channels of that group within its coil element. Note, however, that the terminology of a channel being farther/nearer or farthest/nearest refers to the electrical connection of channels (e.g., wherein the signal transmission coax cable(s) of farther channels is hidden inside the coil element(s) of nearer channel(s), etc.), not the actual position or geometric arrangement, which is independent of such connections. For example, referring to FIG. 9, illustrated is a pair of diagrams showing two example geometric arrangements 900 and 910 of M groups of N connected channels via hidden signal transmission coax cable techniques according to various aspects discussed herein. In FIG. 9, the solid lines indicate connections between channels in groups having hidden signal cables, and the dashed lines indicate connections of those groups to the composite cable. Numerous additional geometric arrangements of M groups of N connected channels are also possible. Different geometric arrangements may have different advantages, for example, in terms of SNR, etc.

Various embodiments discussed herein provide several advantages over existing systems. A first advantage is that techniques discussed herein can minimize the coupling between cables and coil elements for improved SNR performance. A second advantage is that techniques discussed herein can reduce the number of electronics, and thus the size in the coil area. If coax cables and coil elements are flexible, the coil area will be more flexible if the electronics sizes are minimized since most electrical components, such as PCB (Printed Circuit Board) and baluns are still rigid.

Examples herein can include subject matter such as a method, means for performing acts or blocks of the method, at least one machine-readable medium including executable instructions that, when performed by a machine (e.g., MRI machine, for example as described herein, etc.) cause the machine to perform acts of the method or of an apparatus or system according to embodiments and examples described.

A first example embodiment comprises a magnetic resonance imaging (MRI) radio frequency (RF) coil array (e.g., configured to be employed as RF antennas $150_i$ in an MRI system, e.g., example MRI system 100) is configured to operate in at least one of a transmit (Tx) mode or in a receive (Rx) mode, the MRI RF coil array comprising: at least two RF coil elements, wherein the output transmission cable(s) of one or more RF coil elements (e.g., of one or more farthest channels) are used as part of an additional coil element (e.g., of a nearest channel); and wherein there is one balun between the part of the additional coil element and the output(s) of the one or more coil elements on the transmission cable(s).

A second example embodiment comprises the first example embodiment, wherein the transmission cable(s) are one of flexible or rigid coax cable(s).

A third example embodiment comprises the first example embodiment, wherein the output(s) of the one or more coil elements are the output(s) after the coil element(s) are matched but before they are amplified.

A fourth example embodiment comprises the first example embodiment, wherein the output(s) of the one or more coil elements are the output(s) of preamplifier(s) of the coil element(s).

A fifth example embodiment comprises the first example embodiment, wherein using the output transmission cable(s) used as part of the additional coil element comprises using the shield(s) of the transmission cable(s) as part of the additional coil element.

A sixth example embodiment comprises the fifth example embodiment, wherein the shield(s) are shorted together (e.g., via soldering at multiple points, etc.) so that they act as one conductor in the part of the coil element.

A seventh example embodiment comprises the sixth example embodiment, wherein a conductive material can be shorted to (e.g., via soldering, etc.) the shield(s) in at least a portion of the part of the coil element.

An eighth example embodiment comprises the first example embodiment, wherein at an output from the output cable(s) exiting the MRI coil area to other electronics, at least one balun is used to isolate the coil area and other electronics.

The following examples are additional embodiments.

Example 1 is a magnetic resonance imaging (MRI) radio frequency (RF) coil array configured to operate in at least one of a transmit (Tx) mode or a receive (Rx) mode, the MRI RF coil array comprising: two or more RF coil elements, comprising: a first RF coil element coupled to a first output transmission cable that is configured to carry a first signal that is associated with the first RF coil element; and a second RF coil element coupled to a second output transmission cable that is configured to carry a second signal that is associated with the second RF coil element, wherein the second RF coil element comprises a first portion of the first output transmission cable; and a first balun configured to reduce coupling associated with the first signal, wherein the first balun is arranged between the first RF coil element and the second RF coil element.

Example 2 comprises the subject matter of any variation of any of example(s) 1, wherein the first output transmission cable and the second output transmission cable comprise one of flexible coaxial cable or rigid coaxial cable.

Example 3 comprises the subject matter of any variation of any of example(s) 1-2, wherein the first portion of the first output transmission cable is configured to carry the first signal with or without amplification.

Example 4 comprises the subject matter of any variation of any of example(s) 3, wherein the MRI RF coil array comprises a first preamplifier configured to amplify the first signal to generate a preamplified first signal, wherein the first preamplifier is one of arranged between the first RF coil element and the second RF coil element or arranged between the second RF coil element and an output of the MRI RF coil array.

Example 5 comprises the subject matter of any variation of any of example(s) 1-4, wherein the first portion of the first output transmission cable comprises a first portion of a shield of the first output transmission cable.

Example 6 comprises the subject matter of any variation of any of example(s) 1-5, further comprising at least one additional balun configured to isolate the MRI RF coil array, wherein the at least one additional balun is arranged at outputs from the MRI RF coil array of the first output transmission cable and the second output transmission cable.

Example 7 comprises the subject matter of any variation of any of example(s) 1-6, further comprising a third RF coil element coupled to a third output transmission cable that is configured to carry a third signal that is associated with the third RF coil element, wherein the third RF coil element comprises a second portion of the first output transmission cable and a first portion of the second output transmission cable.

Example 8 comprises the subject matter of any variation of any of example(s) 7, wherein the second portion of the first output transmission cable comprises a second portion of a shield of the first output transmission cable, wherein the first portion of the second output transmission cable comprises a first portion of a shield of the second output transmission cable, and wherein the second portion of the shield of the first output transmission cable is shorted together with the first portion of the second output transmission cable as a common conductor.

Example 9 comprises the subject matter of any variation of any of example(s) 8, wherein the second portion of the shield of the first output transmission cable is shorted together with the first portion of the second output transmission cable via soldering at one or more locations.

Example 10 comprises the subject matter of any variation of any of example(s) 9, wherein the common conductor comprises an additional conductive material soldered to some or all of the second portion of the shield of the first output transmission cable and the first portion of the second output transmission cable.

Example 11 comprises the subject matter of any variation of any of example(s) 7-10, further comprising a second balun configured to reduce coupling associated with both the first signal and the second signal, wherein the second balun is arranged between the second RF coil element and the third RF coil element.

Example 12 comprises the subject matter of any variation of any of example(s) 11, wherein a first half of the third RF coil element comprises both the second portion of the first output transmission cable and the first portion of the second output transmission cable.

Example 13 comprises the subject matter of any variation of any of example(s) 7-10, further comprising: a second balun configured to reduce coupling associated with the second signal, wherein the second balun is arranged between the second RF coil element and the third RF coil element; and a third balun configured to reduce coupling associated with the first signal, wherein the third balun is arranged between the second RF coil element and the third RF coil element, wherein the third balun is different from the first balun.

Example 14 comprises the subject matter of any variation of any of example(s) 13, wherein a first half of the third RF coil element comprises the second portion of the first output transmission cable, wherein a second half of the third RF coil element comprises the first portion of the second output transmission cable, and wherein the first half of the third RF coil element is different from the second half of the third RF coil element.

Example 15 comprises the subject matter of any variation of any of example(s) 7-14, further comprising an additional RF coil element coupled to an additional output transmission cable that is configured to carry an additional signal that is associated with the additional RF coil element, wherein the additional RF coil element comprises a plurality of portions of output transmission cables, the plurality comprising at least: an associated portion of the first output transmission cable, an associated portion of the second output transmission cable, and an associated portion of the third output transmission cable.

Example 16 is a magnetic resonance imaging (MRI) radio frequency (RF) coil array configured to operate in at least one of a transmit (Tx) mode or a receive (Rx) mode, the MRI RF coil array comprising: one or more groups of two or more RF coil elements, wherein each group of the one or more groups comprises: a first RF coil element of that group coupled to a first output transmission cable of that group that is configured to carry a first signal of that group that is associated with the first RF coil element of that group; a second RF coil element of that group coupled to a second output transmission cable of that group that is configured to carry a second signal of that group that is associated with the second RF coil element of that group, wherein the second RF coil element of that group comprises a first portion of the first output transmission cable of that group; and a first balun of that group configured to reduce coupling associated with the first signal of that group, wherein the first balun of that group is arranged between the first RF coil element of that group and the second RF coil element of that group.

Example 17 comprises the subject matter of any variation of any of example(s) 16, wherein, for each group of RF coil elements, the first output transmission cable of that group and the second output transmission cable of that group comprise one of flexible coaxial cable or rigid coaxial cable.

Example 18 comprises the subject matter of any variation of any of example(s) 16-17, wherein, for each group of RF coil elements, the first portion of the first output transmission cable of that group is configured to carry the first signal of that group with or without amplification.

Example 19 comprises the subject matter of any variation of any of example(s) 18, wherein the MRI RF coil array comprises a first preamplifier configured to amplify the first signal to generate a preamplified first signal, wherein the first preamplifier is one of arranged between the first RF coil element and the second RF coil element or arranged between the second RF coil element and an output of the MRI RF coil array.

Example 20 comprises the subject matter of any variation of any of example(s) 16-19, wherein, for each group of RF coil elements, the first portion of the first output transmission cable of that group comprises a first portion of a shield of the first output transmission cable of that group.

Example 21 comprises the subject matter of any variation of any of example(s) 16-20, wherein each group of RF coil elements further comprises an additional RF coil element of that group coupled to an additional output transmission cable of that group that is configured to carry an additional signal of that group that is associated with the additional RF coil element of that group, wherein the additional RF coil element of that group comprises a plurality of portions of output transmission cables of that group, the plurality comprising at least: an associated portion of the first output transmission cable of that group and an associated portion of the second output transmission cable of that group.

Example 22 is a magnetic resonance imaging (MRI) radio frequency (RF) coil array configured to operate in at least one of a transmit (Tx) mode or a receive (Rx) mode, the MRI RF coil array comprising: a RF coil element coupled to an output transmission cable that is configured to carry a signal that is associated with a channel of the RF coil element, wherein the RF coil element comprises, for each output transmission cable of one or more additional output transmission cables, an associated portion of that additional output transmission cable, wherein each additional output transmission cable of the one or more additional output transmission cables is configured to carry an associated signal of an associated channel for that additional output transmission cable; and at least one balun configured to reduce coupling associated with the associated signal of the associated channel for each additional output transmission cable, wherein the at least one balun is arranged at an input of the one or more additional output transmission cables to the RF coil element.

Example 23 comprises the subject matter of any variation of any of example(s) 22, wherein the one or more additional output transmission cables comprises two or more additional output transmission cables, and wherein a first half of the RF coil element comprises the associated portion for each additional output transmission cable of the two more additional output transmission cables.

Example 24 comprises the subject matter of any variation of any of example(s) 22-23, wherein the one or more additional output transmission cables comprises two or more additional output transmission cables, wherein a first half of the RF coil element comprises the associated portion of a first additional output transmission cable of the two or more additional output transmission cables, wherein a second half of the RF coil element comprises the associated portion of a second additional output transmission cable of the two or more additional output transmission cables, wherein the first half of the RF coil element is different from the second half of the RF coil element, and wherein the first additional output transmission cable is different from the second additional output transmission cable.

Example 25 is a MRI system comprising a MRI RF coil array according to any variation of any of example(s) 1-24.

Circuits, apparatus, elements, MRI RF coils, arrays, methods, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the disclosure and appended claims. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "various embodiments," "one example", "an example", or "various examples" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrases "in one embodiment" or "in various embodiments" does not necessarily refer to the same embodiment(s), though it may.

"Circuit", as used herein, includes but is not limited to hardware, firmware, or combinations of each to perform a function(s) or an action(s), or to cause a function or action from another circuit, logic, method, or system. Circuit can include a software controlled microprocessor, a discrete logic (e.g., ASIC), an analog circuit, a digital circuit, a programmed logic device, a memory device containing instructions, and other physical devices. A circuit can include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical logic between multiple physical circuits.

"Computer-readable storage device", as used herein, refers to a device that stores instructions or data. "Computer-readable storage device" does not refer to propagated signals. A computer-readable storage device can take forms, including, but not limited to, non-volatile media, and volatile media. Non-volatile media can include, for example, optical disks, magnetic disks, tapes, and other media. Volatile media can include, for example, semiconductor memories, dynamic memory, and other media. Common forms of a computer-readable storage device can include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store can store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature can be combined with one or more other features of the other implementations as may be desired and advantageous for any given or particular application.

What is claimed is:

1. A magnetic resonance imaging (MRI) radio frequency (RF) coil array configured to operate in at least one of a transmit (Tx) mode or a receive (Rx) mode, the MRI RF coil array comprising:
   two or more RF coil elements, comprising:
      a first RF coil element coupled to a first output transmission cable that is configured to carry a first signal that is associated with the first RF coil element; and
      a second RF coil element coupled to a second output transmission cable that is configured to carry a second signal that is associated with the second RF coil element, wherein the second RF coil element comprises a first portion of the first output transmission cable; and
   a first balun configured to reduce coupling associated with the first signal, wherein the first balun is arranged between the first RF coil element and the second RF coil element.

2. The MRI RF coil array of claim 1, wherein the first output transmission cable and the second output transmission cable comprise one of flexible coaxial cable or rigid coaxial cable.

3. The MRI RF coil array of claim 1, wherein the first portion of the first output transmission cable is configured to carry the first signal with or without amplification.

4. The MRI RF coil array of claim 3, wherein the MRI RF coil array comprises a first preamplifier configured to amplify the first signal to generate a preamplified first signal, wherein the first preamplifier is one of arranged between the first RF coil element and the second RF coil element or arranged between the second RF coil element and an output of the MRI RF coil array.

5. The MRI RF coil array of claim 1, wherein the first portion of the first output transmission cable comprises a first portion of a shield of the first output transmission cable.

6. The MRI RF coil array of claim 1, further comprising at least one additional balun configured to isolate the MRI RF coil array, wherein the at least one additional balun is arranged at outputs from the MRI RF coil array of the first output transmission cable and the second output transmission cable.

7. The MRI RF coil array of claim 1, further comprising a third RF coil element coupled to a third output transmission cable that is configured to carry a third signal that is associated with the third RF coil element, wherein the third RF coil element comprises a second portion of the first output transmission cable and a first portion of the second output transmission cable.

8. The MRI RF coil array of claim 7, wherein the second portion of the first output transmission cable comprises a second portion of a shield of the first output transmission cable, wherein the first portion of the second output transmission cable comprises a first portion of a shield of the second output transmission cable, and wherein the second portion of the shield of the first output transmission cable is shorted together with the first portion of the second output transmission cable as a common conductor.

9. The MRI RF coil array of claim 8, wherein the second portion of the shield of the first output transmission cable is shorted together with the first portion of the second output transmission cable via soldering at one or more locations.

10. The MRI RF coil array of claim 9, wherein the common conductor comprises an additional conductive material soldered to some or all of the second portion of the shield of the first output transmission cable and the first portion of the second output transmission cable.

11. The MRI RF coil array of claim 7, further comprising a second balun configured to reduce coupling associated with both the first signal and the second signal, wherein the second balun is arranged between the second RF coil element and the third RF coil element.

12. The MRI RF coil array of claim 11, wherein a first half of the third RF coil element comprises both the second portion of the first output transmission cable and the first portion of the second output transmission cable.

13. The MRI RF coil array of claim 7, further comprising:
   a second balun configured to reduce coupling associated with the second signal, wherein the second balun is arranged between the second RF coil element and the third RF coil element; and
   a third balun configured to reduce coupling associated with the first signal, wherein the third balun is arranged between the second RF coil element and the third RF coil element, wherein the third balun is different from the first balun.

14. The MRI RF coil array of claim 13, wherein a first half of the third RF coil element comprises the second portion of the first output transmission cable, wherein a second half of the third RF coil element comprises the first portion of the second output transmission cable, and wherein the first half of the third RF coil element is different from the second half of the third RF coil element.

15. The MRI RF coil array of claim 7, further comprising an additional RF coil element coupled to an additional output transmission cable that is configured to carry an additional signal that is associated with the additional RF coil element, wherein the additional RF coil element comprises a plurality of portions of output transmission cables, the plurality comprising at least: an associated portion of the first output transmission cable, an associated portion of the second output transmission cable, and an associated portion of the third output transmission cable.

16. A magnetic resonance imaging (MRI) radio frequency (RF) coil array configured to operate in at least one of a transmit (Tx) mode or a receive (Rx) mode, the MRI RF coil array comprising:
   one or more groups of two or more RF coil elements, wherein each group of the one or more groups comprises:
      a first RF coil element of that group coupled to a first output transmission cable of that group that is configured to carry a first signal of that group that is associated with the first RF coil element of that group;

a second RF coil element of that group coupled to a second output transmission cable of that group that is configured to carry a second signal of that group that is associated with the second RF coil element of that group, wherein the second RF coil element of that group comprises a first portion of the first output transmission cable of that group; and a first balun of that group configured to reduce coupling associated with the first signal of that group, wherein the first balun of that group is arranged between the first RF coil element of that group and the second RF coil element of that group.

17. The MRI RF coil array of claim 16, wherein, for each group of RF coil elements, the first output transmission cable of that group and the second output transmission cable of that group comprise one of flexible coaxial cable or rigid coaxial cable.

18. The MRI RF coil array of claim 16, wherein, for each group of RF coil elements, the first portion of the first output transmission cable of that group is configured to carry the first signal of that group with or without amplification.

19. The MRI RF coil array of claim 18, wherein the MRI RF coil array comprises a first preamplifier configured to amplify the first signal to generate a preamplified first signal, wherein the first preamplifier is one of arranged between the first RF coil element and the second RF coil element or arranged between the second RF coil element and an output of the MRI RF coil array.

20. The MRI RF coil array of claim 16, wherein, for each group of RF coil elements, the first portion of the first output transmission cable of that group comprises a first portion of a shield of the first output transmission cable of that group.

21. The MRI RF coil array of claim 16, wherein each group of RF coil elements further comprises an additional RF coil element of that group coupled to an additional output transmission cable of that group that is configured to carry an additional signal of that group that is associated with the additional RF coil element of that group, wherein the additional RF coil element of that group comprises a plurality of portions of output transmission cables of that group, the plurality comprising at least: an associated portion of the first output transmission cable of that group and an associated portion of the second output transmission cable of that group.

22. A magnetic resonance imaging (MRI) radio frequency (RF) coil array configured to operate in at least one of a transmit (Tx) mode or a receive (Rx) mode, the MRI RF coil array comprising:

a RF coil element coupled to an output transmission cable that is configured to carry a signal that is associated with a channel of the RF coil element, wherein the RF coil element comprises, for each output transmission cable of one or more additional output transmission cables, an associated portion of that additional output transmission cable, wherein each additional output transmission cable of the one or more additional output transmission cables is configured to carry an associated signal of an associated channel for that additional output transmission cable; and at least one balun configured to reduce coupling associated with the associated signal of the associated channel for each additional output transmission cable, wherein the at least one balun is arranged at an input of the one or more additional output transmission cables to the RF coil element.

23. The MRI RF coil array of claim 22, wherein the one or more additional output transmission cables comprises two or more additional output transmission cables, and wherein a first half of the RF coil element comprises the associated portion for each additional output transmission cable of the two more additional output transmission cables.

24. The MRI RF coil array of claim 22, wherein the one or more additional output transmission cables comprises two or more additional output transmission cables, wherein a first half of the RF coil element comprises the associated portion of a first additional output transmission cable of the two or more additional output transmission cables, wherein a second half of the RF coil element comprises the associated portion of a second additional output transmission cable of the two or more additional output transmission cables, wherein the first half of the RF coil element is different from the second half of the RF coil element, and wherein the first additional output transmission cable is different from the second additional output transmission cable.

* * * * *